(12) United States Patent
You et al.

(10) Patent No.: US 10,660,243 B2
(45) Date of Patent: May 19, 2020

(54) POWER CONVERSION APPARATUS INCLUDING A HEAT-DISSIPATION MODULE

(71) Applicant: Delta Electronics (Shanghai) Co., Ltd., Shanghai (CN)

(72) Inventors: Peiai You, Shanghai (CN); Hao Sun, Shanghai (CN); Jinfa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/240,802

(22) Filed: Jan. 7, 2019

(65) Prior Publication Data

US 2019/0243431 A1 Aug. 8, 2019

(30) Foreign Application Priority Data

Feb. 6, 2018 (CN) .......................... 2018 1 0118947

(51) Int. Cl.
*H05K 7/20* (2006.01)
*H01H 9/52* (2006.01)

(52) U.S. Cl.
CPC .......... *H05K 7/20927* (2013.01); *H01H 9/52* (2013.01); *H05K 7/2049* (2013.01); *H05K 7/20472* (2013.01); *H05K 7/20872* (2013.01)

(58) Field of Classification Search
CPC .. H05K 7/20845–20927; H05K 7/2049; H01L 23/4093; H01L 23/46; H01L 23/473; H01H 9/52
USPC ................................................. 361/699–719
See application file for complete search history.

(56) References Cited

U.S. PATENT DOCUMENTS

| 9,655,288 | B2 * | 5/2017 | You | ........................ H02J 7/0042 |
| 9,668,384 | B2 * | 5/2017 | You | ........................ H05K 7/1432 |
| 2015/0146378 | A1 * | 5/2015 | You | ........................ H05K 7/20254 361/707 |
| 2015/0146380 | A1 * | 5/2015 | Lu | ........................ H05K 7/1432 361/709 |

(Continued)

FOREIGN PATENT DOCUMENTS

| CN | 104682457 A | 6/2015 |
| CN | 106561076 A | 4/2017 |

*Primary Examiner* — Zachary Pape
(74) *Attorney, Agent, or Firm* — CKC & Partners Co., LLC

(57) ABSTRACT

A power conversion apparatus is provided, which comprises a housing, a mother board, a first electromagnetic filtering board, a second electromagnetic filtering board, a signal board, a capacitor board, and a heat-dissipation module. The housing includes a heat-dissipation wall and a coolant runner. The mother board is disposed upon the housing and comprises a first surface facing the housing and a power device. The heat-dissipation module includes an thermal conductive insulating sheet adhered to the heat-dissipation wall and an elastic clamp. When the mother board approaches the housing to clamp the power device in the accommodating space between the elastic clamp and the thermal conductive insulating sheet, the power device is pressed against by the elastic clamp and thus adhered to the thermal conductive insulating sheet, so that the power device is thermally coupled to the heat-dissipation wall and the coolant runner via the thermal conductive insulating sheet.

20 Claims, 10 Drawing Sheets

(56) References Cited

U.S. PATENT DOCUMENTS

2018/0343775 A1* 11/2018 Huang ................ H01L 23/4093
2019/0245430 A1* 8/2019 You .................... H05K 7/20381

* cited by examiner

POWER CONVERSION APPARATUS INCLUDING A HEAT-DISSIPATION MODULE

CROSS-REFERENCE TO RELATED APPLICATIONS

This non-provisional application claims priority under 35 U.S.C. § 119(a) on Patent Application No. 201810118947.0 filed in P.R. China on Feb. 6, 2018, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present invention relates to a power supply unit, and particularly to a power conversion apparatus with high power density.

BACKGROUND ART

An On Board Charge Module (OBCM) refers to a power conversion apparatus mounted in an electric vehicle and charging an on-board battery pack through an AC grid on the ground. With the OBCM, a user can charge the electric vehicle by directly inserting an AC power cable into a socket of the electric vehicle. Such power conversion apparatus includes at least a power conversion module, a base housing, and the like. The power conversion module is used to convert an external power supply into an AC/DC power supply for various voltage levels used in the vehicle. When the power conversion module is operating, a large amount of heat is generated. The base housing provides a heat-dissipation design to dissipate the heat generated by the power conversion module, so as to avoid the accumulation of heat affecting the overall performance of the power conversion module. At present, however, both the design of the power conversion module and the heat dissipation design correspondingly provided by the base housing are not good enough, resulting in a large overall volume of the on-board charge module and low power density.

Therefore, one problem in the field that needs to be settled urgently is how to develop a power conversion apparatus to solve the problems in the prior art.

DISCLOSURE OF THE PRESENT INVENTION

It is an object of the present invention to provide a power conversion apparatus. By way of optimization of the layout of various components, it is possible to provide simple and reliable assembly, while enhancing the heat-dissipation capability of the respective components, reducing the overall volume of the power conversion apparatus and increasing the overall power density of the power conversion apparatus.

It is another object of the present invention to provide a power conversion apparatus. A power device on the mother board is adhered and fixed to a heat-dissipation wall of a housing via a thermal conductive insulating heat-dissipation module, while the respective components are disposed between the mother board and the housing and accommodated in an accommodating groove of the housing, the heat-dissipation wall and the accommodating groove of the housing all being thermally coupled to the coolant runner of the housing, so that the interface thermal resistance is reduced and the assembly structure is simplified, thereby achieving the goal of reducing costs and improving the reliability and heat-dissipation capability of the power conversion apparatus.

In order to achieve the above-mentioned objects, the present invention provides a power conversion apparatus, comprising a housing, a mother board, a first electromagnetic filtering board, a second electromagnetic filtering board, a signal board, a capacitor board, and a heat-dissipation module. The housing includes at least one heat-dissipation wall and a coolant runner. The heat-dissipation wall is thermally coupled to the coolant runner. The mother board is disposed upon the housing. The mother board comprises a first surface and at least one power device, wherein the first surface faces the housing and the power device comprises a first face and a second face. The first electromagnetic filtering board is disposed upon the housing and electrically connected to the mother board. The second electromagnetic filtering board is disposed upon the housing and electrically connected to the mother board. The signal board is disposed upon the housing and electrically connected to the mother board. The capacitor board is disposed upon the housing and electrically connected to the mother board. The heat-dissipation module includes at least one thermal conductive insulating sheet and at least one elastic clamp. The thermal conductive insulating sheet is adhered to the corresponding heat-dissipation wall. The elastic clamp is fixed to the housing and opposite to the thermal conductive insulating sheet, so that the elastic clamp and the thermal conductive insulating sheet form an accommodating space. When the first surface of the mother board approaches the housing and the power device is clamped and fixed into the accommodating space formed by the elastic clamp and the thermal conductive insulating sheet, the power device is pressed against by the elastic clamp at its first face and thus adhered to the thermal conductive insulating sheet at its second face, so that the power device is thermally coupled to the heat-dissipation wall and the coolant runner via the thermal conductive insulating sheet.

DETAILED DESCRIPTION OF EMBODIMENTS

Some typical embodiments that embody the features and advantages of the present invention will be described in detail in the following paragraphs. It will be appreciated that the present invention can have various changes in various aspects, none of which deviate from the scope of the present invention, and the descriptions and figures therein are substantially used for illustration and not for limiting the present invention.

Figure 1:
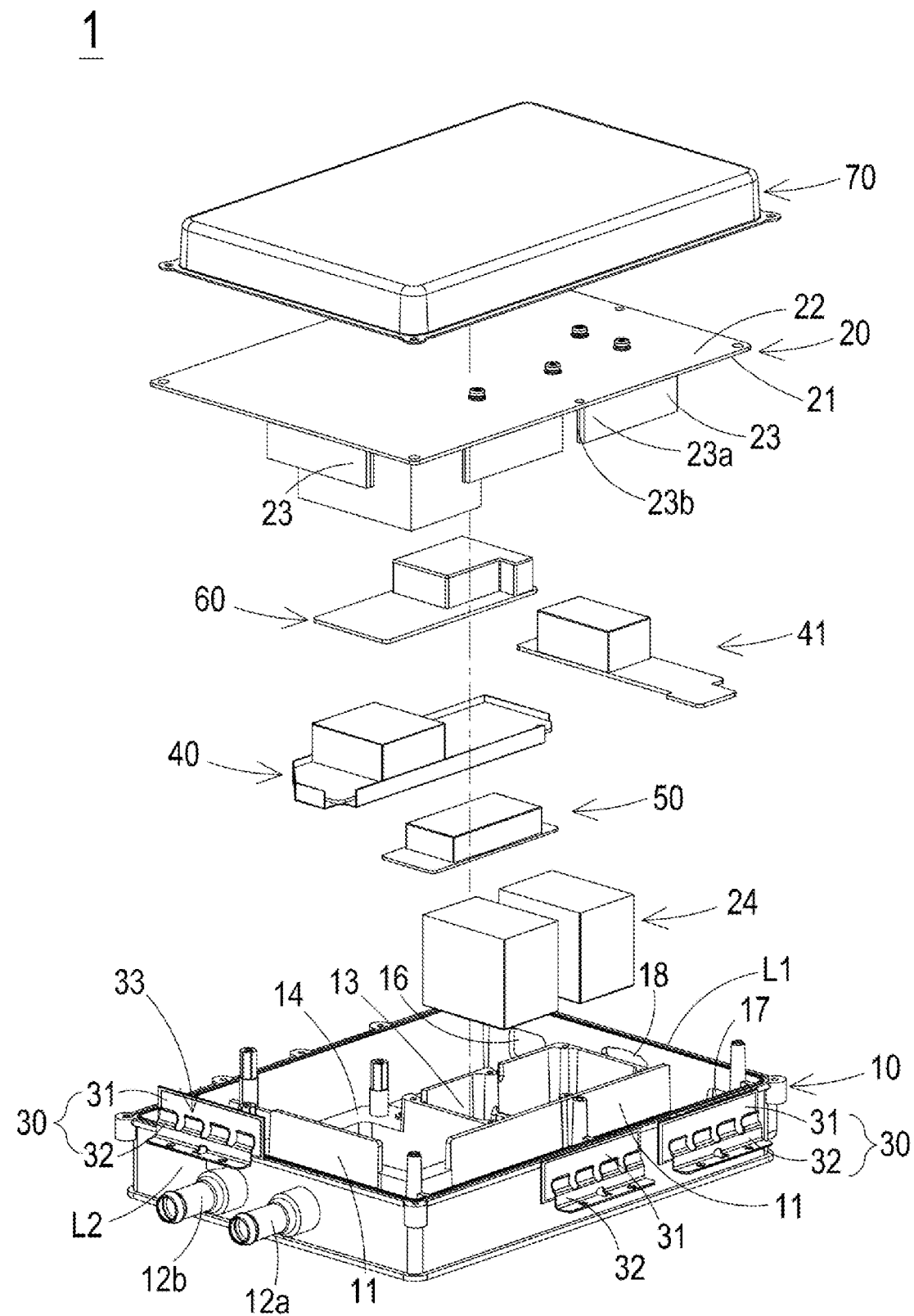
FIG. 1 is an exploded view illustrating the structure of a power conversion apparatus according to a first preferred embodiment of the present invention.
Figure 2:
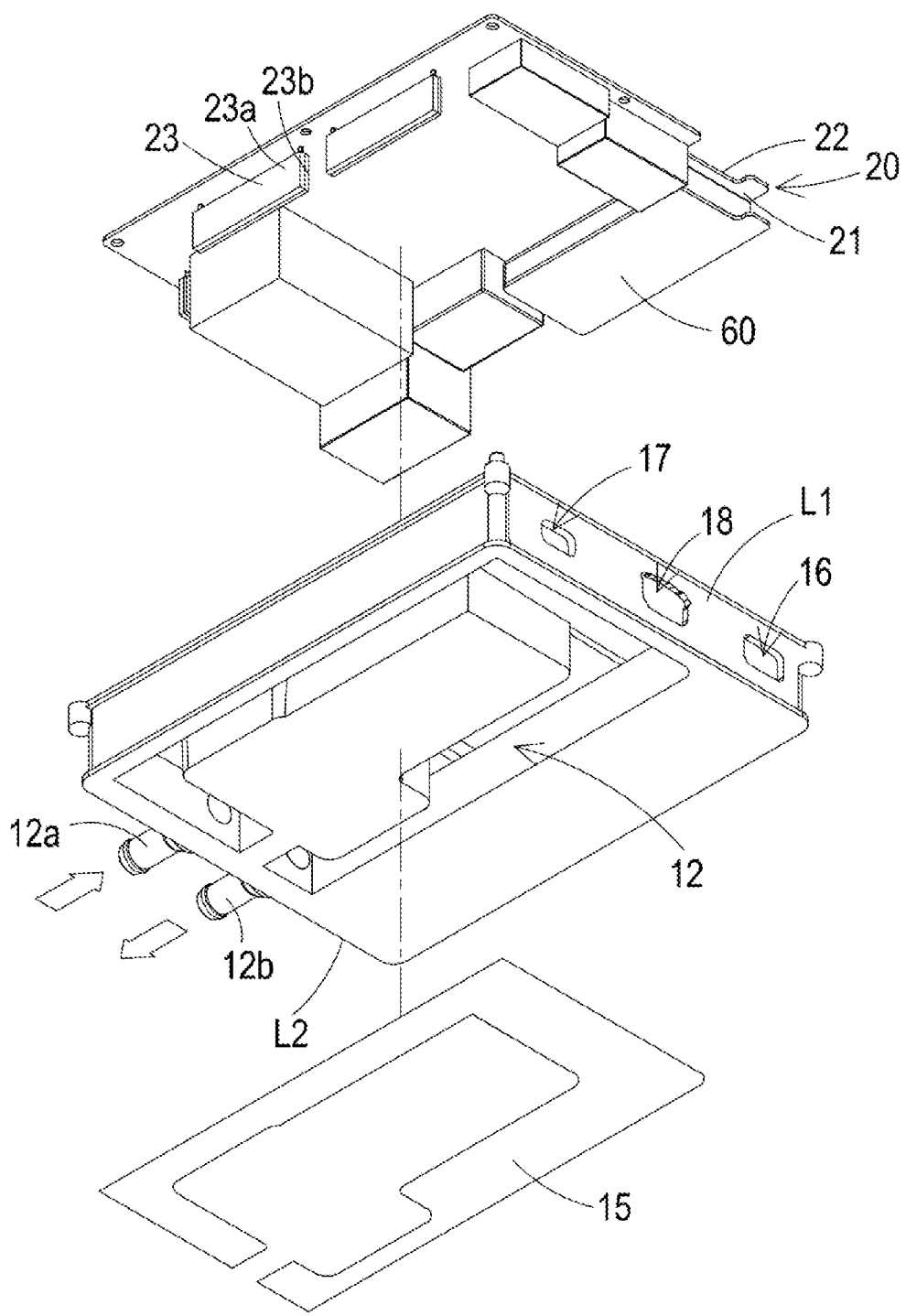
FIG. 2 is an exploded view illustrating a part of the structure of the power conversion apparatus according to the first preferred embodiment of the present invention.
Figure 3:
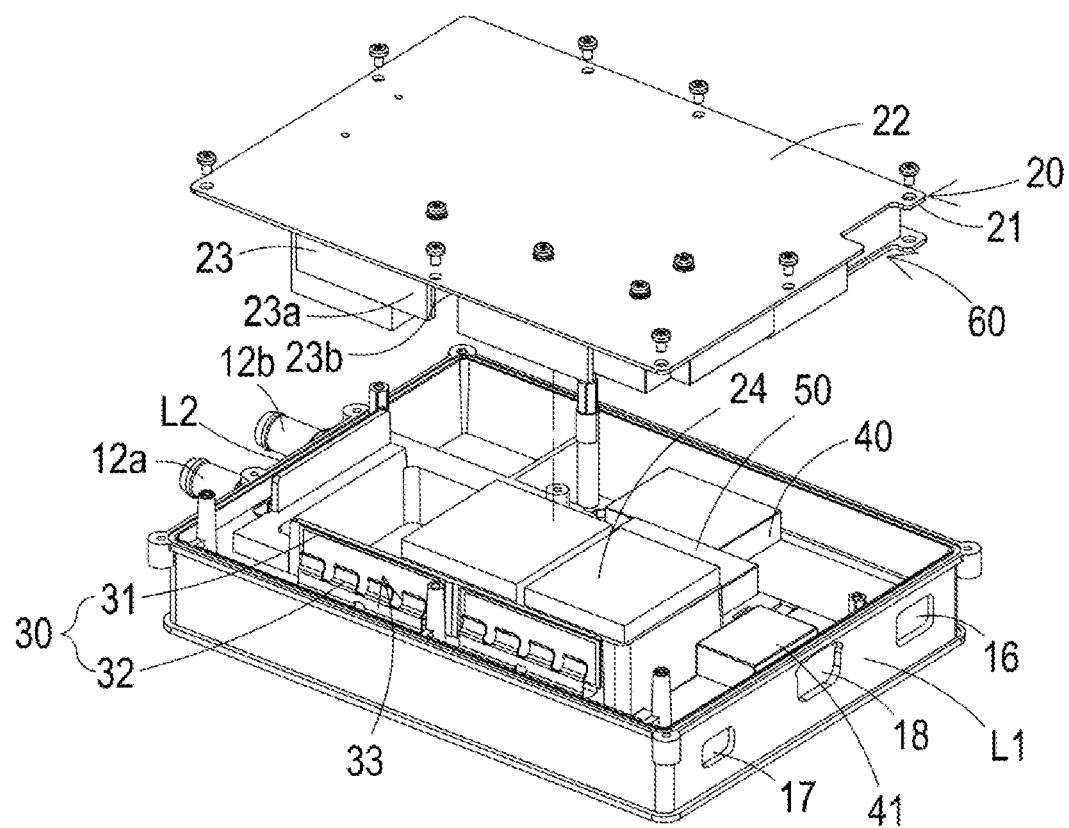
FIG. 3 is an exploded view from another perspective, illustrating a part of the structure of the power conversion apparatus according to the first preferred embodiment of the present invention.

FIG. 1 is an exploded view illustrating the structure of a power conversion apparatus according to a first preferred embodiment of the present invention. FIG. 2 is an exploded view illustrating a part of the structure of the power conversion apparatus according to the first preferred embodiment of the present invention. FIG. 3 is an exploded view from another perspective, illustrating a part of the structure of the power conversion apparatus according to the first preferred embodiment of the present invention. As shown in FIGS. 1 to 3, the power conversion apparatus 1 of the present invention comprises a housing 10, a mother board 20, a first electromagnetic filtering board 40, a second electromagnetic filtering board 41, a capacitor board 50, a signal board 60, and a heat-dissipation module 30. The housing 10 includes at least one heat-dissipation wall 11 and a coolant runner 12, wherein the heat-dissipation wall 11 is thermally coupled to the coolant runner 12. The mother board 20 is disposed upon the housing 10. The mother board 20 comprises a first surface 21 facings the housing 10, a second surface 22, and at least one power device 23 disposed on the first surface 21 and including a first face 23a and a second face 23b. The first and second electromagnetic filtering boards 40 and 41 are respectively disposed between the first surface 21 of the mother board 20 and the housing 10, and are electrically connected to the mother board 20, respectively. The capacitor board 50 is disposed between the first surface 21 of the mother board 20 and the housing 10, and is electrically connected to the mother board 20. The signal board 60 is disposed between the first surface 21 of the mother board 20 and the housing 10, and is electrically connected to the mother board 20.

The heat-dissipation module 30 includes at least one thermal conductive insulating sheet 31 and one elastic clamp 32. The thermal conductive insulating sheet 31 can be, for example but not limited to, a Direct-Bond-Copper (DBC) ceramic substrate. The thermal conductive insulating sheet 31 is adhered to the corresponding heat-dissipation wall 11, while the elastic clamp 32 is fixed to the housing 10 and opposite to the thermal conductive insulating sheet 31, so that the elastic clamp 32 and the thermal conductive insulating sheet 31 form an accommodating space 33. When the first surface 21 of the mother board 20 approaches the housing 10 and the power device 23 is clamped in the accommodating space 33 formed by the elastic clamp 32 and the thermal conductive insulating sheet 31, the power device 23 is pressed against by the elastic clamp 32 at its first face 23a and is thus adhered to the thermal conductive insulating sheet 31 at its second face 23b, so that the power device 23 is thermally coupled to the heat-dissipation wall 11 and the coolant runner 12 via the thermal conductive insulating sheet 31. It should be noted that, the fashion in which the elastic clamp 32 presses against the first face 23a of the power device 23 as well as the order of assembling it to the housing 10 is adjustable according to actual needs, which are not essential features that limit the technical solution of the present invention. Any elastic clamp that can form accommodating space 33 with respect to the heat-dissipation wall 11 and maintain the elastic force is suitable for the present invention that is not limited to this embodiment.

In addition, it should be noted that, in other embodiments, the power device 23 may be disposed on the second surface 22 of the mother board 20, while the mother board 20, the first electromagnetic filtering board 40, the second electromagnetic filtering board 41, the capacitor board 50, and the signal board 60 are all disposed within the housing 10. When the first surface 21 of the mother board 20 approaches the housing 10, in which the mother board 20, the first electromagnetic filtering board 40, the second electromagnetic filtering board 41, the capacitor board 50, and the signal board 50 and the power device 23 are accommodated, with the power device 23 on the second surface 22 being clamped in the accommodating space 33 between the elastic clamp 32 and the thermal conductive insulating sheet 31, the power device 23 is pressed against by the elastic clamp 32 at its first face 23a and is thus adhered to the thermal conductive insulating sheet 31 at its second face 23b, so that the power device 23 is thermally coupled to the heat-dissipation wall 11 and the coolant runner 12 via the electric-insulating and heat-conductive sheet 31. Therefore, the position where the power device 23 is disposed on the mother board 20 is also adjustable according to the actual applications and needs. The present invention is not limited to the foregoing embodiments and the relevant details will not be repeated. In the above embodiment, the mother board 20 can be composed of one or more circuit boards.

Particularly, although, according to the actual application needs, the heat-dissipation wall 11 of the invention can be disposed at any position on the housing 2 where it can be thermally coupled to the coolant runner 12, in this embodiment, it is preferably disposed adjacent to the peripheral side of the housing 10. Furthermore, the power device 23 may be, for example but not limited to, an in-line power device, which is inserted on the first surface 21 of the mother board 20 (i.e. the power device is disposed to stand upright on the mother board 20), and is preferably disposed adjacent to the peripheral side of the mother board 20. In another aspect, with respect to the heat-dissipation wall 11, the thermal conductive insulating sheet 31 can be pre-bonded to the corresponding heat-dissipation wall 11 via, for example but not limited to, a thermal conductive adhesive (not shown) while the elastic clamp 32 can be pre-fixed to the housing 10 by using, for example but not limited to, a bolt, so that a desired accommodating space 33 is formed by the elastic clamp 32 and the thermal conductive insulating sheet 31, so as to accommodate and clamp the power device 23 later. In one embodiment, the power device 23 can be bonded to the thermal conductive insulating sheet 31 via, for example but not limited to, a thermal conductive adhesive (not shown).

It should be noted that, since the heat-dissipation module 30 is disposed on the peripheral side of the housing 10 corresponding to the heat-dissipation wall 11 while the power device 23 is disposed adjacent to the peripheral side of the mother board 20, the elastic clamp 32 may be pre-fixed to the housing 10, or may be locked to the housing 10 by using for example but not limited to a bolt when the mother board 20 has been disposed upon the housing 10, so that the power device 23 is pressed against by the elastic clamp 32 at its first face 23a and is thus adhered to the thermal conductive insulating sheet 31 at its second face 23*b*, so that the power device 23 is accommodated and clamped in the accommodating space 33 and thermally coupled to the heat-dissipation wall 11 and the coolant runner 12 via the thermal conductive insulating sheet 31. In addition, the power conversion apparatus 1 further comprises an outer cover 70 disposed upon the housing 10 and the mother board 20 and covering the second surface 22 of the mother board 20 to protect the power conversion apparatus 1.

In another aspect, in this embodiment, the power conversion apparatus 1 is further constructed as a bidirectional power conversion apparatus to perform AC-DC or DC-AC power conversion. In addition to the first electromagnetic filtering board 40, the second electromagnetic filtering board 41, the capacitor board 50, and the signal board 60 that are correspondingly electrically connected to the mother board 20, the mother board 20 further comprises a magnetic component 24. The magnetic component 24 is disposed on the first surface 21 of the mother board 20. The power device 23 is disposed further adjacent to the side of the magnetic component 24. In this embodiment, in order to constructing the power conversion apparatus 1 to have both high power density and high heat-dissipation efficiency, the housing 10 comprises, in addition to the heat-dissipation wall 11 as described above, a first accommodating groove 13, and a second accommodating groove 14, wherein the first accommodating groove 13 and the second accommodating groove 14 are thermally coupled to the cooling runner 12 like the aforementioned heat-dissipation wall 11. The magnetic component 24 may be pre-disposed in the first accommodating groove 13, and electrically connected to the mother board when the mother board 20 has been disposed upon the housing 10.

Additionally, when the mother board 20 is disposed upon the housing 10, the second face 23*b* of the power device 23 is thermally coupled to the heat-dissipation wall 11 of the housing 10 via the thermal conductive insulating sheet 31 of the heat-dissipation module 30. Also, when the mother board 20 is disposed upon the housing 10, the first electromagnetic filtering board 40, the second electromagnetic filtering board 41, the capacitor board 50, and the signal board 60 are accommodated in the second accommodating groove 14. The first electromagnetic filtering board 40, the second electromagnetic filtering board 41, and the capacitor board 50 are disposed on the bottom surface of the second accommodating groove 14. The signal board 60 may be adhered to the first surface 21 of the mother board 20 so as to be disposed between the mother board 20 and the first electromagnetic filtering board 40 or between the mother board 20 and the second electromagnetic filtering board 41. In this embodiment, the magnetic component 24 is accommodated in the first accommodating groove 13 while the first electromagnetic filtering board 40 and the second electromagnetic filtering board 41 are accommodated in the second accommodating groove 14, with the first accommodating groove 13 and the second accommodating groove 14 being thermally coupled to the coolant runner 12, so that the heat generated by the magnetic component 24, the first electromagnetic filtering board 40, and the second electromagnetic filtering board 41 can be transmitted to the coolant runner 12 via the first accommodating groove 13 and the second accommodating groove 14 and thus dissipate. In one embodiment, the number of the magnetic component 24 may be designed according to actual needs of the product, such as two. In another embodiment, the magnetic component can be a transformer module or an inductor module.

In one embodiment, when the magnetic component 24 is accommodated in the first accommodating groove 13 while the first and second electromagnetic filtering boards 40 and 41 are accommodated in the second accommodating groove 14, for example but not limited to, an thermal conductive insulating adhesive (not shown) can be added into the first accommodating groove 13 and the second accommodating groove 14, so as to increase the efficiency of the magnetic component 24 and the first and second electromagnetic filtering boards 40 and 41 for thermally coupling to the coolant runner 12 via the first accommodating groove 13 and the second accommodating groove 14, respectively. In this embodiment, the second accommodating groove 14 is disposed surrounding and adjacent to sidewalls of the first accommodating groove 13. The heat-dissipation wall 11 is disposed at the peripheral side of the housing 10, or disposed at the peripheral side of the housing 10 and adjacent to a sidewall of the first accommodating groove 13. The power device 23 can be constructed as for example a secondary-side power device and a primary-side power device.

In addition, the first and second electromagnetic filtering boards 40 and 41, and the signal board 60 that are electrically connected to the mother board 20 are further accommodated in the second accommodating groove 14, and thermally coupling to the coolant runner 12 via the second accommodating groove 14. Thereby, the power device 23, the magnetic component 24, the first electromagnetic filtering board 40, the second electromagnetic filtering board 41, the capacitor board 50, and the signal board 60 can be simply and reliably assembled and fixed between the housing 10 and the mother board 20, enhancing the heat-dissipation capability of the power device 23, the magnetic component 24, the first electromagnetic filtering board 40, and the second electromagnetic filtering board 41, while reducing the overall volume of the power conversion apparatus 1 and increasing the overall power density of the power conversion apparatus 1.

Figure 4:
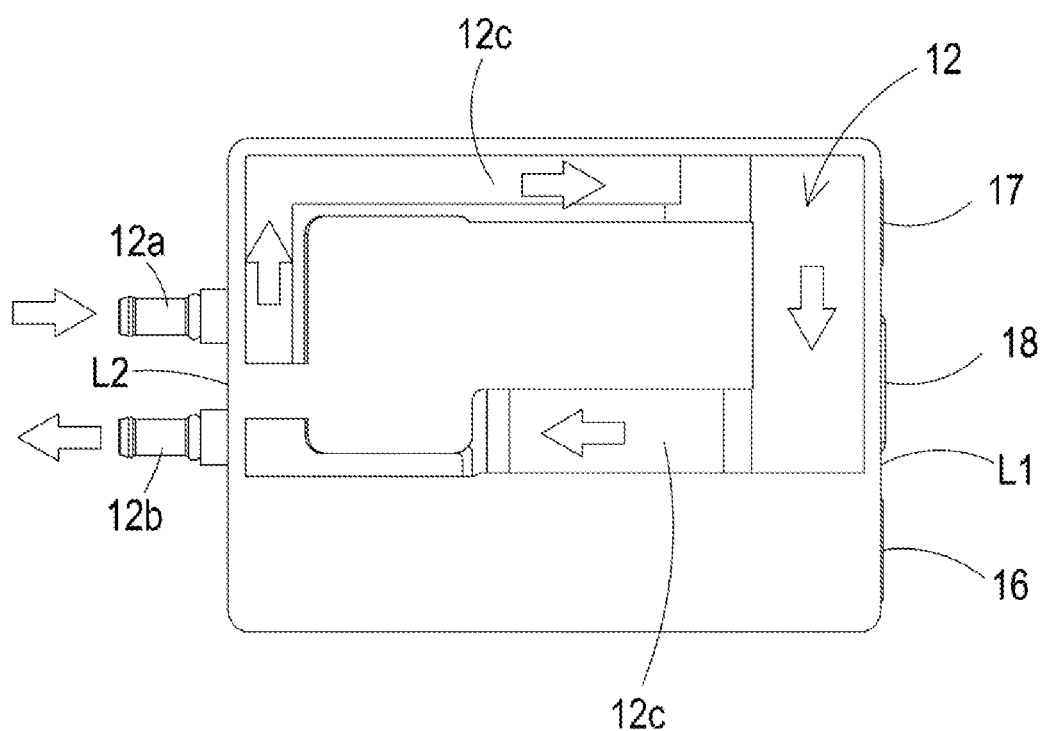
FIG. 4 is a configuration diagram of a coolant runner according to the first preferred embodiment of the present invention.

In this embodiment, the coolant runner 12 of the housing 10 is further formed between faces where the heat-dissipation wall 11, the first accommodation groove 13, and the second accommodation groove 14 are located, which may be for example at least one channel 12*c* and configured to be covered by a bottom cover 15. The bottom cover 15 may be adhered to the housing 10 by, for example but not limited to, an adhesive way, so as to form the coolant runner 12. The housing 10 further comprises a liquid inlet pipe 12*a* and a liquid outlet pipe 12*b*, the liquid inlet pipe 12*a* and the liquid outlet pipe 12*b* being communicated with each other through the channel 12*c* of the coolant runner 12. FIG. 4 is a diagram showing the configuration of a coolant runner in the first preferred embodiment of the present invention. As shown in FIG. 2, FIG. 3 and FIG. 4, in this embodiment, the channel 12*c* of the coolant runner 12 is further thermally coupled to the heat-dissipation wall 11 and the sidewall of the first accommodating groove 13 adjacent to the second accommodating groove 14. Thereby, the cooling runner 12 can efficiently take away the heat generated by the power device 23 thermally coupled to the heat-dissipation 11 via the thermal conductive insulating sheet 31, the magnetic component 24 thermally coupled to the first accommodating groove 13, and the first and second electromagnetic filtering boards 40 and 41 thermally coupled to the second accommodating groove 14, thus improving the heat-dissipation capability of the power conversion apparatus 1. Of course, the arrangement of the cooling runner 12 of the housing 10 with respect to the heat-dissipation wall 11, the first accommodating groove 13 and the second accommodating groove 14 can be adjusted according to actual needs. The present invention is not limited to this embodiment, and the relevant details will not be repeated.

Figure 5:
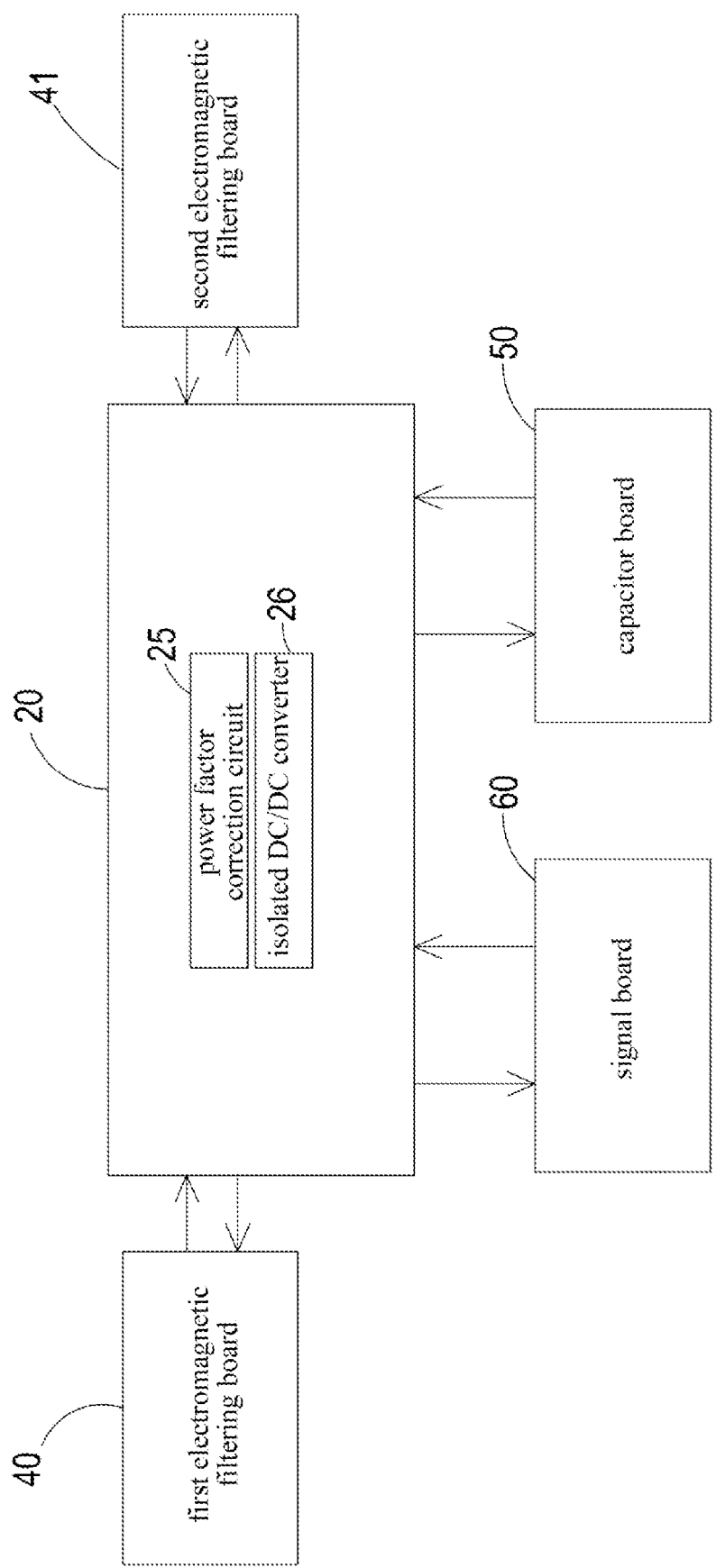
FIG. 5 is a circuit block diagram illustrating the power conversion apparatus according to the first preferred embodiment of the present invention.

It should be noted that, in this embodiment, the power conversion apparatus 1 is constructed as a bidirectional power conversion apparatus for performing AC-DC power conversion. The power conversion apparatus 1 further comprises a first power transmission terminal 16, a second power transmission terminal 17, and a signal transmission terminal 18, which can be disposed on for example a first side L1 of the housing 10, opposite to a second side L2 where the liquid input pipe 12a and the liquid output pipe 12g are disposed. FIG. 5 is a circuit block diagram illustrating a power conversion apparatus according to the first preferred embodiment of the present invention. To realize the bidirectional power conversion apparatus, the power device 23 and the magnetic component 24 on the mother board 20 are further assembled and constructed with other electronic components into, for example, a bidirectional power factor correction circuit 25 and a bidirectional isolated DC/DC converter 26. The first and second electromagnetic filtering boards 40 and 41 electrically connected to the mother board 20 may be constructed as, for example, an AC electromagnetic filtering board and a high-voltage DC electromagnetic filtering board, respectively. In addition, the signal board 60 electrically connected to the mother board 20 may be constructed as, for example, a low voltage signal board.

Referring to FIG. 3 and FIG. 5, when the power conversion apparatus performs power conversion, an input power may be firstly transmitted via the first power transmission terminal 16 or the second power transmission terminal 17 to the first electromagnetic filtering board 40 or the second electromagnetic filtering board 41, and then transmitted to the power factor correction circuit 25 of the mother board 20, converted by the mother board 20, and then output via the first power transmission terminal 16 or the second power transmission terminal 17. On the other hand, when the power conversion apparatus performs signal processing, the input signal is transmitted via the signal transmission terminal 18 to the low voltage signal board constructed by the signal board 60, traveling through the primary side and the secondary side constructed by the power device 23 on the mother board 20, and then output via the signal board 60 and the signal transmission terminal 18.

It should be noted that, in this embodiment, further due to the demands of performing the power conversion and the signal processing as above described, the first electromagnetic filtering board 40, the second electromagnetic filtering board 41, and the signal board 60 are disposed adjacent to the first side L1 where the first power transmission terminal 16, the second power transmission terminal 17, and the signal transmission terminal 18 are located, so as to reduce the distance from the first and second power transmission terminals 16 and 17 to the first and second electromagnetic filtering boards 40 and 41, as well as the distance from the signal transmission terminal 18 to the signal board 60, thereby improving the power efficiency of the power conversion apparatus 1. Of course, the arrangement of the first power transmission terminal 16, the second power transmission terminal 17, and the signal transmission terminal 18 with respect to the first electromagnetic filtering board 40, the second electromagnetic filtering board 41, and the signal board 60 can be adjusted according to actual needs. The present disclosure is not limited to the foregoing embodiment.

Particularly, the arrangement of the individual components of the power conversion apparatus 1 can be optimized, making their assembly and fixing simple and reliable, enhancing the heat-dissipation capability of the individual components, and reducing the overall volume of the power conversion apparatus and increasing the overall power density of the power conversion apparatus. FIGS. 6 to 10 are schematic views illustrating the structure of the power conversion apparatus at different steps of assembly according to the first preferred embodiment of the present invention.

Figure 6:
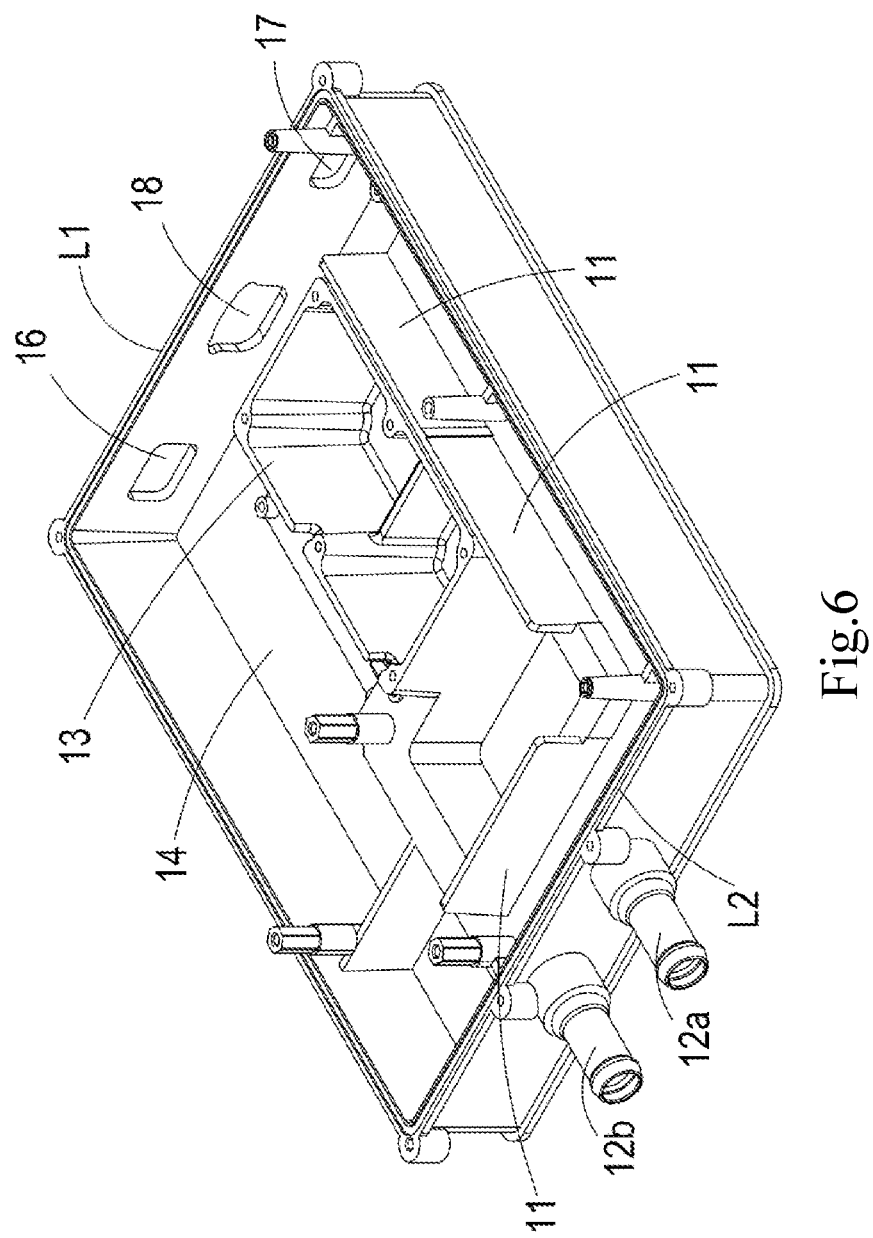
FIGS. 6 to 10 are schematic views illustrating the structure of the power conversion apparatus at different steps of assembly according to the first preferred embodiment of the present invention.

Firstly, as shown in FIG. 6, in this embodiment, the housing 10 includes at least one heat-dissipation wall 11, a coolant runner 12 (with reference to FIG. 2), a first accommodating groove 13, a second accommodating groove 14, a bottom cover 15, a first power transmission terminal 16, a second power transmission terminal 17, a signal transmission terminal 18, a liquid inlet pipe 12a, and a liquid outlet pipe 12b. The first power transmission terminal 16, the second power transmission terminal 17, and the signal transmission terminal 18 are disposed on the first side L1 of the housing 10. The liquid inlet pipe 12a and the liquid outlet pipe 12b are disposed on the second side L2 opposite to the first side L1. The coolant runner 12 is disposed on an opposite bottom surface with respect to the heat-dissipation wall 11, the first accommodating groove 13, the second accommodating groove 14, so as to thermally couple to the heat-dissipation wall 11, the first accommodating groove 13, the second accommodating groove 14.

Figure 7:
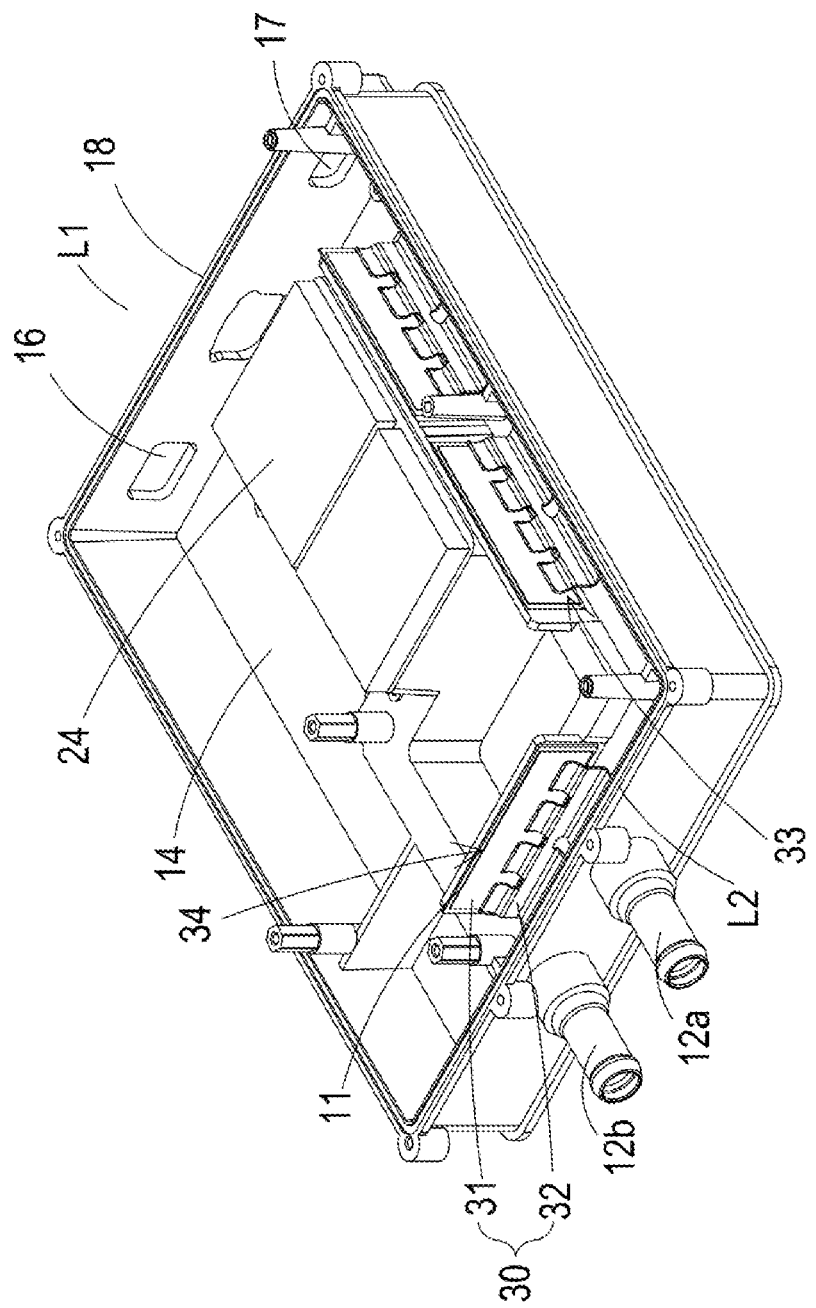

In another aspect, as shown in FIG. 7, the thermal conductive insulating sheet 31 of the heat-dissipation module 30 may be, for example but not limited to, a Direct-Bond-Copper (DBC) ceramic substrate, and are pre-bonded to the corresponding heat-dissipation wall 11 via, for example but not limited to, a thermal conductive adhesive 34. In this embodiment, the elastic clamp 32 of the heat-dissipation module 30 is pre-fixed to the housing 10 by using for example but not limited to a bolt, so that a desired accommodating space 33 is formed between the elastic clamp 32 and the thermal conductive insulating sheet 31 for accommodating and clamping the power device 23 later. However, it should be noted that the order in which the elastic clamp 32 is fixed to the housing 10 is not an essential technical feature limiting the present invention. In other embodiment, the elastic clamp 32 can be locked to the housing 10 after the second face 23b of the power device 23 being disposed adjacent to the thermal conductive insulating sheet 31, so that the power device 23 is pressed against by the elastic clamp 32 at its first face 23a and is thus adhered to the thermal conductive insulating sheet 31 at its second face 23b, so that the power device 23 is accommodated and clamped in the accommodating space 33 and thermally coupled to the heat-dissipation wall 11 and the coolant runner 12 via the thermal conductive insulating sheet 31. In the other aspect, the magnetic component 24 electrically connected to the mother board 20 may also be accommodated in the first accommodating groove 13 in advance. In such embodiment, when the magnetic component 24 is accommodated in the first accommodating groove 13, the first accommodating groove 13 can be filled with for example but not limited to a thermal conductive adhesive (not shown), so as to enhance the efficiency of thermally coupling the magnetic component 24 to the cooling runner 12 via the first accommodating groove 13.

Figure 8:
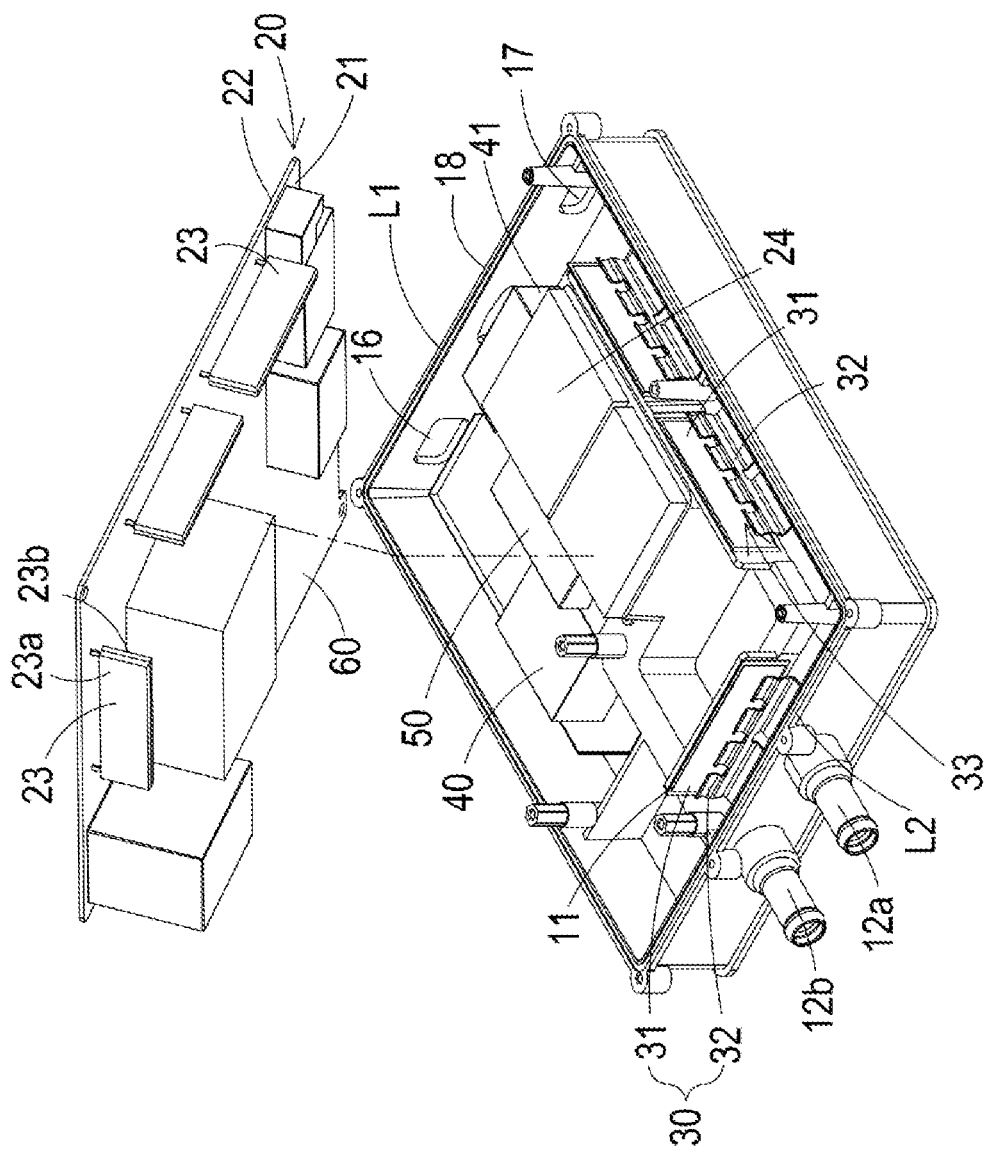

Next, as shown in FIG. 8, the first electromagnetic filtering board 40, the second electromagnetic filtering board 41, and the capacitor board 50, which are connected to the mother board 20, may also be accommodated in the second accommodating groove 14 in advance, while the signal board 60 may be assembled on the first surface 21 of the mother board 20 in advance. Likewise, in this embodiment, when the first electromagnetic filtering board 40, the second electromagnetic filtering board 41, and the capacitor board 50 are accommodated in the second accommodating groove 14, the second accommodating groove 14 can be filled with, for example but not limited to, a thermal conductive adhesive (not shown), so as to enhance the efficiency of thermally coupling the first electromagnetic filtering board 40, the second electromagnetic filtering board 41, and the capacitor board 50 to the cooling runner 12 via the second accommodating groove 14. It should be noted that, since the power conversion apparatus 1 of the present invention may be configured as, for example, a bidirectional power conversion apparatus, for the demands of performing the power conversion and the signal processing as previously described, when the first electromagnetic filtering board 40, the second electromagnetic filtering board 41, and the capacitor board 50 are accommodated in the second accommodating groove 14, said electromagnetic filtering board 40, second electromagnetic filtering board 41, and capacitor board 50 can be disposed adjacent to places of the first side L1 where the first power transmission terminal 16, the second power transmission terminal 17, and the signal transmission terminal 18 are located, respectively, so as to reduce the distance from the first and second power transmission terminals 16 and 17 to the first and second electromagnetic filtering boards 40 and 41 and the distance from the signal transmission terminal 18 to the signal board 60, thereby improving the power efficiency of the power conversion apparatus 1.

Figure 9:
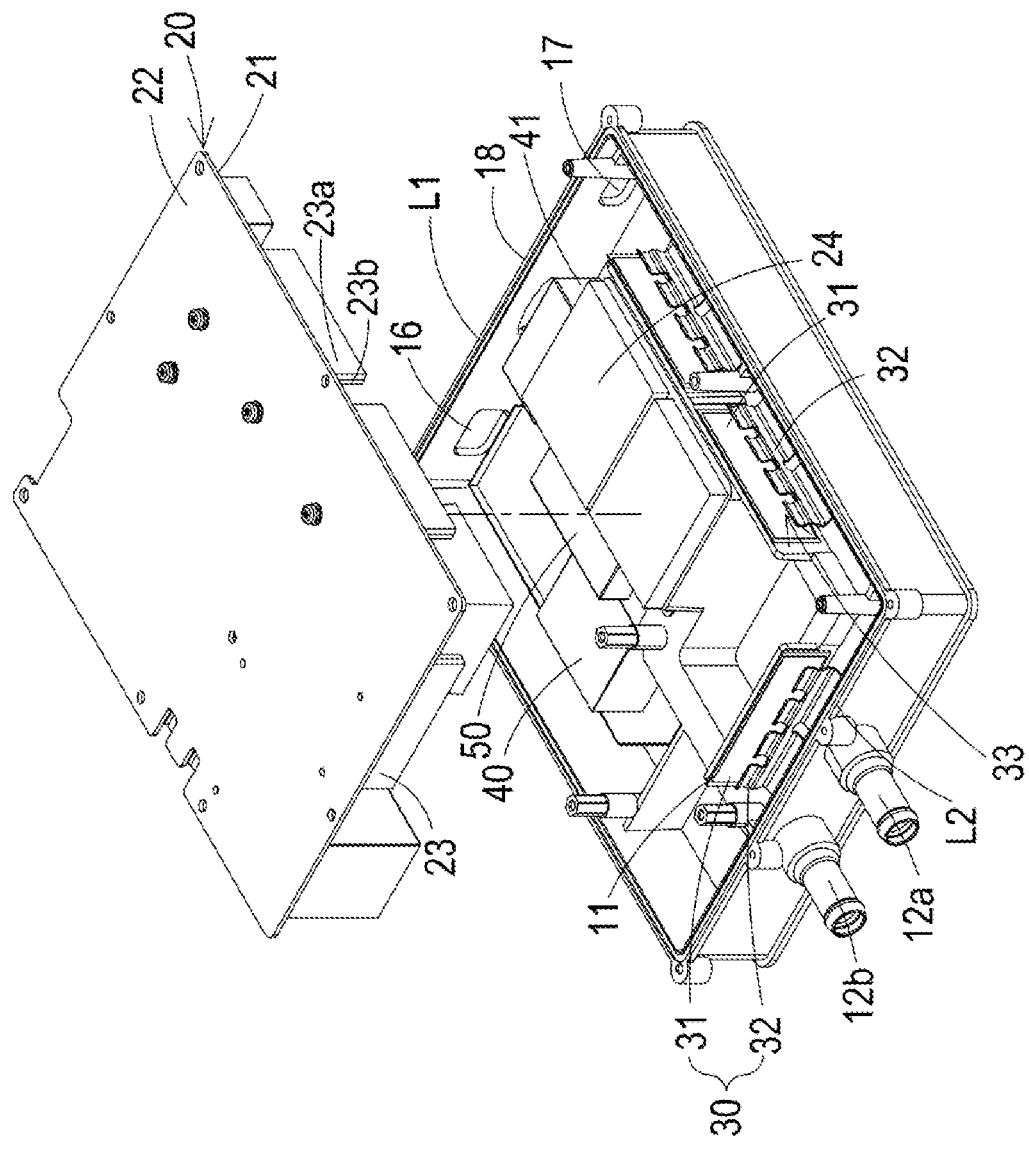
Figure 10:
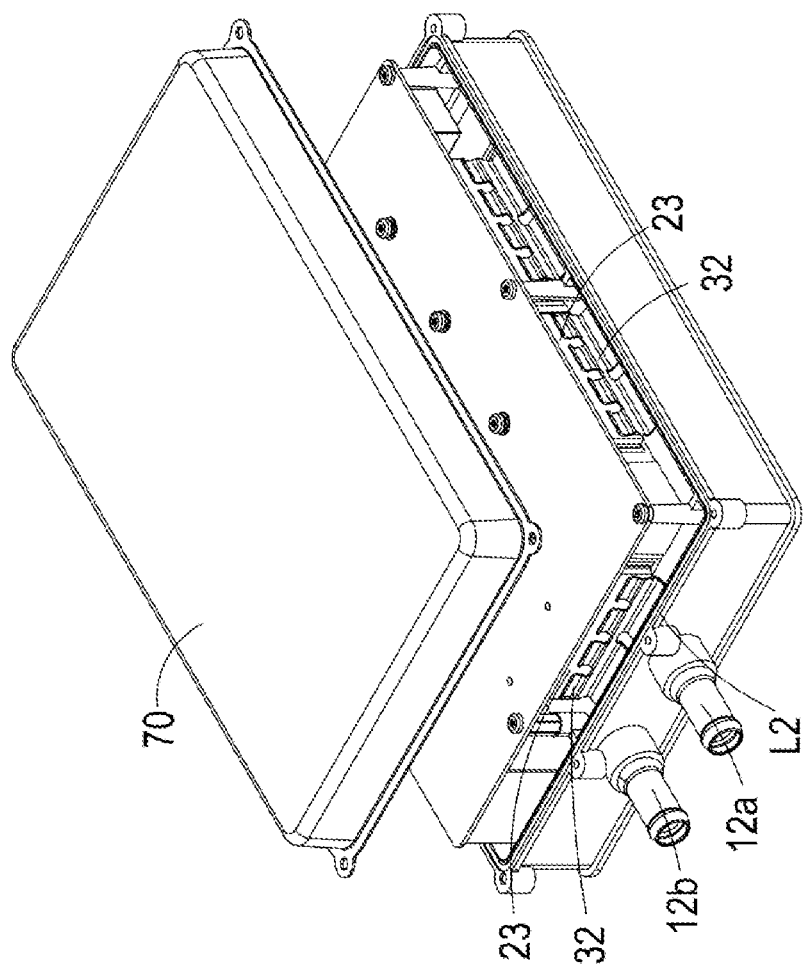

Then, as shown in FIG. 9, when the first surface 21 of the mother board 20 approaches the housing 10, the power device 23 on the mother board 20 is aligned to the accommodating space 33 constructed by the elastic clamp 32 and the thermal conductive insulating sheet 31 on the housing 10, while the mother board 20 can be locked to the housing 10 by, for example but not limited to, a bolt. In this embodiment, the elastic clamp 32 is pre-fixed to the housing 10 and forms the accommodating space 33 with the thermal conductive insulating sheet 31. Then, when the first surface 21 of the mother board 20 approaches the housing 10, the power device 23 can be inserted into the accommodating space 33, so that the power device 23 is pressed against by the elastic clamp 32 at its first face 23a and is thus adhered to the thermal conductive insulating sheet 31 at its second face 23b, so that the power device 23 is thermally coupled to the heat-dissipation wall 11 and the coolant runner 12 via the thermal conductive insulating sheet 31. The assembled power conversion apparatus 1 is shown in FIG. 10.

It should be noted that, in this embodiment, the elastic clamp 32 of the heat-dissipation module 30 is disposed on the peripheral side of the housing 10 corresponding to the heat-dissipation wall 11, while the power device 23 is disposed adjacent to the peripheral side of the mother board 20. Thus, the elastic clamp 32 may be locked to the housing 10 by using, for example but not limited to a bolt, after the mother board 20 being disposed upon the housing 10, so that the power device 23 is pressed against by the elastic clamp 32 at its first face 23a and is thus adhered to the thermal conductive insulating sheet 31 at its second face 23b, so that the power device 23 is thermally coupled to the heat-dissipation wall 11 and the coolant runner 12 via the thermal conductive insulating sheet 31. Of course, the elastic clamp 32 also may be disposed on the peripheral side of the housing 10 in advance. The elastic force by which the elastic clamp 32 presses against the first face 23a of the power device 23 may be adjusted after the mother board 20 being constructed upon the housing 10. It should be noted that the fashion in which the elastic clamp 32 presses against the first face 23a of the power device 23 and the order of assembling the elastic clamp 32 into the housing 10 is adjustable according to actual needs, which are not essential features that limit the technical solution of the present invention. Any elastic clamp 31 that can form accommodating space 33 with respect to the heat-dissipation wall 11 and maintain the elastic force is suitable for the power conversion apparatus 1 of the present invention, which is not limited to this embodiment. In this embodiment, the power conversion apparatus 1 may further include an outer cover 70, which is disposed upon the housing 10 and the mother board 20 and covers the second surface 22 of the mother board 20 to protect the power conversion apparatus 1.

Particularly, in this embodiment, when the power conversion apparatus 1 is construct as, for example, a bidirectional power conversion apparatus, the main heat generation components that performs bidirectional conversation of the AC and DC powers, such as the power device 23, the magnetic component 24, the first electromagnetic filtering board 40, and the second electromagnetic filtering board 41 on the mother board 20 in this embodiment, are all thermally coupled to the coolant runner 12 of the housing 10 at the shortest distances. The power device 23 that may generate a large amount of heat are further thermally coupled to the heat-dissipation wall 11 of the housing 10 via, for example, a Direct-Bond-Copper (DBC) ceramic substrate, so as to reduce interface thermal resistance. More preferably, between the second face 23b of the power device 23 and the thermal conductive insulating sheet 31, and between the thermal conductive insulating sheet 31 and the heat-dissipation wall 11, a thermal interface material, such as but not limited to, a thermal conductive adhesive 34 (see FIG. 7) can be further disposed, so as to further decrease the interface thermal resistance in the heat dissipation path. In another aspect, for example but not limited to, an thermal conductive insulating adhesive (not shown) can be filled into the first accommodating groove 13 accommodating the magnetic component 24 and the second accommodating groove 14 accommodating the first and second electromagnetic filtering boards 40 and 41, so as to enhance the efficiency of thermally coupling the magnetic component 24 and the first and second electromagnetic filtering boards 40 and 41 with the coolant runner 12.

It should be noted that, in addition that the power conversion apparatus 1 of the present invention is designed to allow the main heat generation components to be thermally coupled the coolant runner 12 at the shortest distance, the heat-dissipation wall 11, the first accommodating groove 13, and the second accommodating groove 14 are positioned and arranged with consideration of the electrical connection relationship among the main components. For example, the power device 23 in the embodiment is configured as a secondary-side power device and/or a primary-side power device, which are necessary for performing the bidirectional power conversion. Since the power device 23 corresponds to the heat-dissipation walls 11 while the heat-dissipation walls 11 is disposed adjacent to a sidewall of the first accommodating groove 13, the power device 23 can be disposed adjacent to a place where the magnetic component 24, which can be a transformer in this example, is located, so as to reduce the conduction distance from the power devices at the secondary-side and the primary-side to the transformer, facilitating the reduction of conduction resistances and interference, and improving of efficiency of the power conversion apparatus 1 and the efficiency of heat-dissipation.

Likewise, in order to satisfy the need of the power conversion apparatus 1 to perform bidirectional power conversion and signal processing, the first electromagnetic filtering board 40, the second electromagnetic filtering board 41, and the signal board 60 are disposed adjacent to the first side L1 where the first power transmission terminal 16, the second power transmission terminal 17, and the signal transmission terminal 18 are located, so as to reduce the conduction distance from the first and second power transmission terminals 16 and 17 to the first and second electromagnetic filtering boards 40 and 41 as well as the conduction distance from the signal transmission terminal 18 to the signal board 60, and also improve the efficiency of the power conversion apparatus 1. Furthermore, the liquid inlet pipe 12a and the liquid outlet pipe 12b communicating with the coolant runner 12 may be disposed on the second side L2 opposite to the first side L1, so that the space of the power conversion apparatus 1 can be fully used and the overall volume of the power conversion apparatus 1 can be reduced, achieving the purpose of increasing both the power density and the heat-dissipation efficiency. However, it should be noted that, the optimization of the arrangement of the individual components between the housing 10 and the mother board 20 in the power conversion apparatus 1 described above can be adjusted and changed according to actual needs. The present invention is not limited to the combinations of the foregoing exemplified embodiments, and details will not be repeated here.

The above embodiments are described with the power conversion apparatus 1 configured as a bidirectional power conversion apparatus as an example. In other embodiments, the power conversion apparatus 1 may also be configured as a unidirectional power conversion apparatus.

In summary, the present invention provides a power conversion apparatus. By optimizing the arrangement of individual components, the assembly and fixing of the power conversion apparatus is simple and reliable, while enhancing the heat-dissipation capability of the respective components, reducing the overall volume of the power conversion apparatus, and increasing the overall power density of the power conversion apparatus. Moreover, the power device on the mother board are fixed and adhered to the heat-dissipation surface of the housing via the thermal conductive insulating heat-dissipation module, while the respective components are disposed between the mother board and the housing and accommodated in the accommodating grooves of the housing, and both the heat-dissipation surface and the accommodating grooves of the housing being thermally coupled to the coolant runner of the housing, so as to reduce the interface thermal resistance and simplify the assembly structure, thus achieving the purpose of reducing the costs and improving the reliability and heat-dissipation capability of the assembled structure.

Various modifications of the present invention may be made by those skilled in the art without departing from the scope of the attached claims.

What is claimed is:

1. A power conversion apparatus, comprising
a housing comprising a coolant runner and at least one heat-dissipation wall thermally coupled to the coolant runner;
a mother board disposed upon the housing and comprising a first surface facing the housing; and
at least one power device disposed on the mother board and comprising a first face and a second face;
a first electromagnetic filtering board disposed upon the housing and electrically connected to the mother board;
a second electromagnetic filtering board disposed upon the housing and electrically connected to the mother board;
a signal board disposed upon the housing and electrically connected to the mother board;
a capacitor board disposed upon the housing and electrically connected to the mother board; and
a heat-dissipation module comprising
at least one thermal conductive insulating sheet, adhered to the at least one heat-dissipation wall; and
at least one elastic clamp, fixed to the housing and opposite to the at least one thermal conductive insulating sheet, so that an accommodating space is defined by the elastic clamp and the at least one thermal conductive insulating sheet,
wherein when the mother board approaches the housing to clamp the power device in the accommodating space between the elastic clamp and the at least one thermal conductive insulating sheet, the power device is pressed against by the elastic clamp at the first face and thus adhered to the at least one thermal conductive insulating sheet at the second face, so that the power device is thermally coupled to the at least one heat-dissipation wall and the coolant runner via the at least one thermal conductive insulating sheet.

2. The power conversion apparatus according to claim 1, wherein the power device is disposed on the first surface of the mother board, and wherein the first electromagnetic filtering board, the second electromagnetic filtering board, the signal board, and the capacitor board are all disposed between the first surface of the mother board and the housing.

3. The power conversion apparatus according to claim 1, wherein the housing includes a first accommodating groove and a second accommodating groove, which are thermally coupled to the coolant runner, wherein the second accommodating groove is disposed to at least partly surround the first accommodating groove.

4. The power conversion apparatus according to claim 3, wherein the mother board further comprises at least one magnetic component electrically connected to the mother board and disposed between the first surface of the mother board and the housing.

5. The power conversion apparatus according to claim 4, wherein the mother board further comprises two magnetic components.

6. The power conversion apparatus according to claim 4, wherein the at least one magnetic component is accommodated in the first accommodating groove, while the first electromagnetic filtering board, the second electromagnetic filtering board, and the signal board are accommodated in the second accommodating groove.

7. The power conversion apparatus according to claim 4, wherein the power device is disposed adjacent to a side of the at least one magnetic component.

8. The power conversion apparatus according to claim 3, wherein the at least one heat-dissipation wall is disposed adjacent to a sidewall of the first accommodating groove or is disposed at a peripheral side of the housing.

9. The power conversion apparatus according to claim 3, wherein the coolant runner includes at least one channel.

10. The power conversion apparatus according to claim 9, wherein the at least one channel is thermally coupled to the at least one heat-dissipation wall, a sidewall of the first accommodating groove, or a sidewall of the second accommodating groove.

11. The power conversion apparatus according to claim 1, wherein the power device is disposed to stand upright on the mother board.

12. The power conversion apparatus according to claim 1, further comprising a first power transmission terminal, a second power transmission terminal, and a signal transmission terminal, which are disposed on a first side of the housing.

13. The power conversion apparatus according to claim 12, wherein the first and second electromagnetic filtering boards are an AC electromagnetic filtering board and a high-voltage DC electromagnetic filtering board, respectively, and the signal board is a low voltage signal board.

14. The power conversion apparatus according to claim 12, wherein the mother board further comprises a power factor correction circuit and an isolated DC/DC converter.

15. The power conversion apparatus according to claim 12, wherein the first and second power transmission terminals are electrically connected to the first and second electromagnetic filtering boards, respectively, the first and second electromagnetic filtering boards being disposed adjacent to the first side of the housing, and wherein the signal board is disposed between the mother board and the first or second electromagnetic filtering board, and is disposed adjacent to the first side of the housing.

16. The power conversion apparatus according to claim 12, wherein the housing comprises a liquid inlet pipe and a liquid outlet pipe, wherein the liquid inlet pipe and the liquid outlet pipe communicate with each other through the coolant runner and are disposed on a second side of the housing opposite to the first side of the housing.

17. The power conversion apparatus according to claim 1, wherein the power device is disposed adjacent to a peripheral side of the mother board.

18. The power conversion apparatus according to claim 1, wherein the at least one thermal conductive insulating sheet is a Direct-Bond-Copper ceramic substrate.

19. The power conversion apparatus according to claim 1, wherein the heat-dissipation module further comprises a heat-conducting adhesive disposed between the at least one thermal conductive insulating sheet and the at least one heat-dissipation wall.

20. The power conversion apparatus according to claim 1, wherein the at least one power device is an integrated power module.

* * * * *